(12) United States Patent
Huckaby et al.

(10) Patent No.: US 7,028,234 B2
(45) Date of Patent: Apr. 11, 2006

(54) METHOD OF SELF-REPAIRING DYNAMIC RANDOM ACCESS MEMORY

(75) Inventors: Jennifer F. Huckaby, Raleigh, NC (US); Torsten Partsch, Chapel Hill, NC (US); Johnathan Edmonds, Cary, NC (US); Leonel R. Nino, Cary, NC (US)

(73) Assignee: Infineon Technologies AG, Munich (DE)

( * ) Notice: Subject to any disclaimer, the term of this patent is extended or adjusted under 35 U.S.C. 154(b) by 324 days.

(21) Appl. No.: 10/256,463

(22) Filed: Sep. 27, 2002

(65) Prior Publication Data

US 2004/0064767 A1    Apr. 1, 2004

(51) Int. Cl.
*G11C 29/00* (2006.01)
(52) U.S. Cl. ...................... 714/710; 714/718
(58) Field of Classification Search ........ 714/710–711, 714/719, 733–734, 718; 365/200, 201
See application file for complete search history.

(56) References Cited

U.S. PATENT DOCUMENTS 5,577,050 A     11/1996  Bair et al. .................. 714/710
5,910,921 A *   6/1999   Beffa et al. ................. 365/201
6,073,258 A *   6/2000   Wheater ..................... 714/718
6,188,618 B1    2/2001   Takase ....................... 365/200
6,392,938 B1*   5/2002   Choi et al. .................. 365/200

FOREIGN PATENT DOCUMENTS

JP        2000-011680        1/2000

\* cited by examiner

*Primary Examiner*—Shelly Chase
(74) *Attorney, Agent, or Firm*—Brinks Hofer Gilson & Lione

(57) ABSTRACT

A method of self-repair for a DRAM integrated circuit includes internally generating a bit pattern and writing the pattern to an array of memory cells within the integrated circuit. The DRAM integrated circuit reads from the array and internally compares the read data with the generated pattern to determine addresses for failed memory cells. The DRAM integrated circuit sets internal soft fuses that record the addresses of the failed memory cells and provide substitute memory cells for the failed memory cells from a redundant memory portion of the array. The self-repair process occurs each time the DRAM integrated circuit is powered up, thus permitting the integrated circuit to adapt to failures when installed in electronic devices and lessening the need for repair during manufacturing.

26 Claims, 5 Drawing Sheets

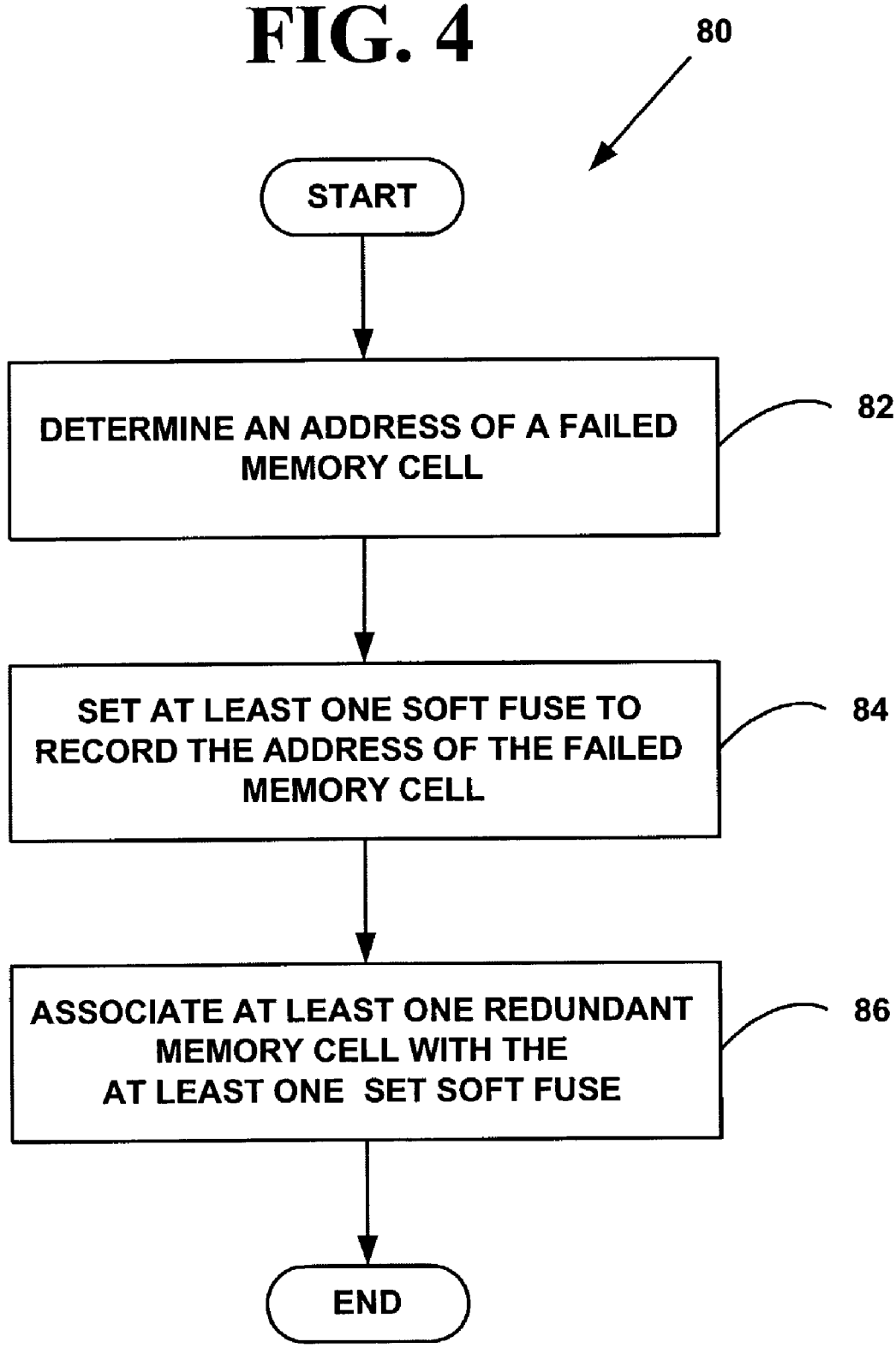

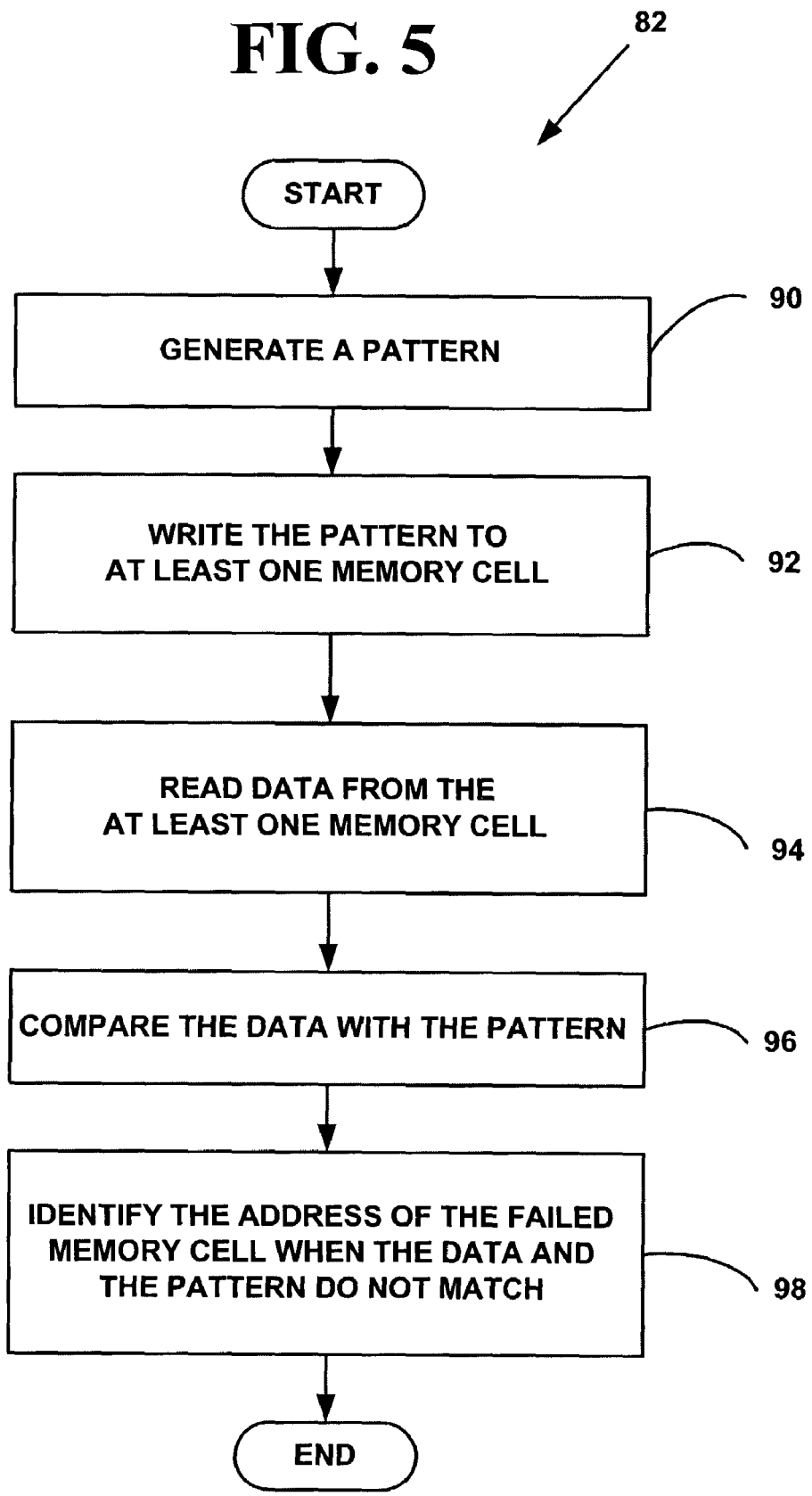

METHOD OF SELF-REPAIRING DYNAMIC RANDOM ACCESS MEMORY

FIELD OF THE INVENTION

This invention relates to Dynamic Random Access Memory. More particularly the invention relates to a method of self-repairing Dynamic Random Access Memory.

BACKGROUND

Many electronic devices and systems include integrated circuits for the storage of data during the operation of the devices. For example, electronic devices such as computers, printing devices, scanning devices, personal digital assistants, calculators, computer work stations, audio and/or video devices, communications devices such as cellular telephones, and routers for packet switched networks may include memory in the form of integrated circuits for retaining data as part of their operation. Advantages of using integrated circuit memory compared to other forms of memory include space conservation and miniaturization, conserving limited battery resources, decreasing access time to data stored in the memory, and cutting the costs of assembling the electronic devices.

Dynamic Random Access Memory ("DRAM") is an example of integrated circuit memory. DRAM typically comprises an array of semiconductor capacitor cells, each of which may hold an amount of electric charge that represents the logical value of a stored bit. The cells in the array are typically arranged in rows and columns. Each cell is defined by the intersection of a row and a column. Each cell in the DRAM array may be accessed by simultaneously addressing the intersecting row and column.

In operation, internal amplifiers in the DRAM sense the amounts of electric charges stored on the capacitors. Based on the sensed electric charges, the outputs of the sense amplifiers represent the logical values of the bits that are stored in the DRAM array. In this manner, the data stored in the array may be extracted from the DRAM integrated circuit for use by other integrated circuits in the electronic device. In addition, other internal circuitry on the DRAM refreshes the charges on those cells. In this manner, the DRAM compensates for leakages of electric charge from the semiconductor capacitor cells, such as leakage into the substrate of the DRAM integrated circuit. Such reading, writing, and maintaining of charge on the cells are substantial internal operations of the DRAM.

Some cells, however, may be defective. These defects may arise from manufacturing inaccuracies, shorting of the electrical connections to cells in neighboring rows or columns, or shorting between the electrical connections of intersecting rows and columns. To repair such defects in the DRAM, the array typically includes redundant rows and columns that may substitute for the defective rows and columns if need be. The DRAM may then be programmed to store the address of a defective row or column, and to transfer memory storage and retrieval to a selected redundant row or column when an attempt is made to access the defective row or column.

Repairing defective cells, rows, and/or columns is typically performed during the process of manufacturing and testing the DRAM. A testing circuit, which may either be internal or external to the DRAM integrated circuit, determines which cells, rows, and/or columns are defective. In one example, the testing circuit writes a logical 'one' and/or a logical 'zero' to each of the cells in the DRAM array. In another example, the testing circuit generates one or more patterns of bits and writes the bit patterns to the DRAM array. The testing circuit subsequently reads the logic levels of the cells and compares the results with what was written to the cells. Differences between what was written and what is read indicate the location of defective cells in the array and the addresses of the associated defective rows and columns containing the defective cells.

After comparing the read results with the written patterns, the testing circuit stores the locations of the defective cells, rows, and/or columns. Based on the stored locations from the testing circuit, programmable fuses on the DRAM are blown to record the addresses of the defective cells, rows, and/or columns on the DRAM. Later attempts to access a defective cell, row, and/or column using a recorded address results in a match of the address within the circuitry that contains the blown fuses. Instead of access to the defective cell, row, and/or column, the DRAM transfers access to a selected redundant cell, row, and/or column that is designated as a substitute for the defective cell, row, and/or column.

The programmable fuses are typically 'hard' fuses that cannot be reset once they are blown. One example of a hard fuse is a narrow polysilicon line on the DRAM integrated circuit that is blown by cutting with a precision laser. Another example of a hard fuse is a narrow polysilicon line on the DRAM integrated circuit that is blown by passing a fusing current through the line. Repair of the DRAM is irreversible using the method described above.

As described above, repairing defective cells, rows, and/or columns is typically performed during the process of manufacturing and testing the DRAM. No further repair occurs after the DRAM is incorporated into an electronic device. But some defects may not develop until the DRAM is in operation within the electronic device. Also, some defects may not have been discovered during the testing of the DRAM and only become apparent when the DRAM is in operation within the electronic device. Using hard fuses that are only blown during the manufacturing and testing process thus precludes the repair of additional defects that arise when the DRAM is in operation within the electronic device. Such a situation may hinder operation of the electronic device and is not repairable.

SUMMARY

Therefore, there is a need for an improved DRAM integrated circuit that tests for defects when the DRAM is in operation within the electronic device. Preferably, if the DRAM determines that a selection of its cells, rows, and/or columns is defective, the DRAM performs a self-repair to substitute redundant cells, rows, and/or columns for the defective cells, rows, and/or columns. In order to address deficiencies in the prior art, aspects of the preferred embodiments are provided.

One aspect is a method of correcting for a failed memory cell in a DRAM integrated circuit. The method includes determining an address of the failed memory cell, setting at least one soft fuse associated with the DRAM integrated circuit to record the address of the failed memory cell, and associating at least one redundant memory cell with the at least one set soft fuse. The redundant memory cell substitutes for the failed memory cell when the DRAM integrated circuit matches the address.

Another aspect is a self-repairing DRAM integrated circuit. The self-repairing DRAM includes at least one memory cell, a pattern generator circuit, a comparator circuit, and a soft fuse circuit. The pattern generator circuit writes a pattern to the at least one memory cell. The comparator circuit compares the pattern with data read from the at least one memory cell. The comparator circuit also determines an address of a failed memory cell when the pattern and the data do not match. The soft fuse circuit records the address of the failed memory cell.

The foregoing and other features and advantages of preferred embodiments of the present invention will be more readily apparent from the following detailed description, which proceeds with reference to the accompanying drawings.

BRIEF DESCRIPTION OF THE DRAWINGS

FIG. 4 is a flow diagram illustrating a preferred method of correcting for a failed memory cell in a DRAM integrated circuit; and FIG. 5 is a flow diagram illustrating a preferred method of determining the address of the failed memory cell in the method of FIG. 4.

DETAILED DESCRIPTION OF THE PRESENTLY PREFERRED EMBODIMENTS

Figure 1:
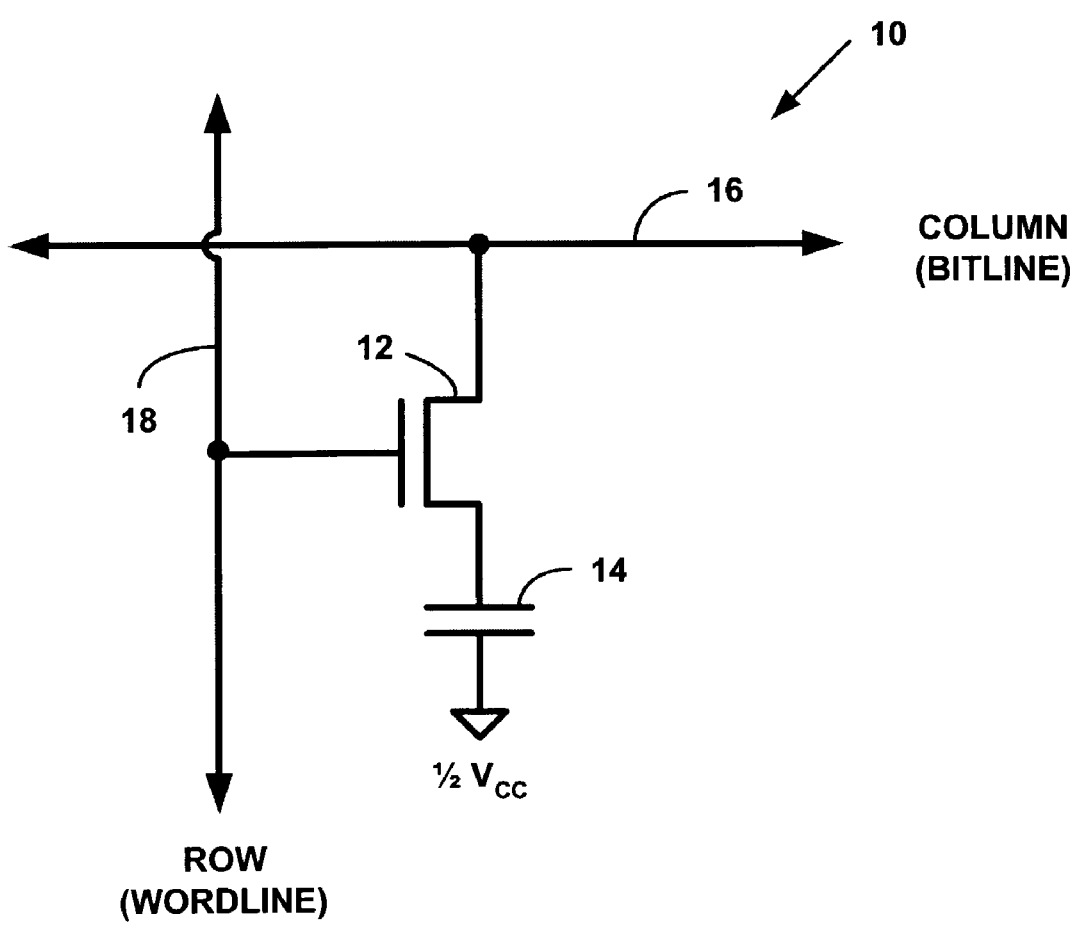
FIG. 1 is a diagram illustrating a preferred configuration of a memory cell in a DRAM array.

FIG. 1 is a diagram illustrating a preferred configuration of a memory cell 10 in a DRAM array. The memory cell 10 in this example includes an N-type metal oxide semiconductor ("MOS") transistor 12 and a capacitor 14. The transistor 12 and capacitor 14 may be formed on a substrate using any number of fabrication techniques known to those of ordinary skill in the DRAM fabrication art. A first end of the MOS transistor 12 conduction path connects to a plate of the capacitor 14. A second end of the MOS transistor 12 conduction path connects to a column conduction path 16 that is common to all cells 10 that are associated in a column. For N-type MOS transistors 12, the end of the conduction path that is at a higher potential relative to the other end is commonly referred to as a "drain" by those of ordinary skill in the art, and the other end of the conduction path is commonly referred to as a "source".

The column conduction path 16 is often termed a "bitline" by those of ordinary skill in the DRAM fabrication art. The gate of the MOS transistor 12 connects to a row conduction path 18 that is common to all cells 10 that are associated in a row. The row conduction path 18 is often termed a "wordline" by those of ordinary skill in the DRAM fabrication art. It should be understood by one of ordinary skill in the art that the orientation of the rows and columns as shown in FIG. 1 are rotated by ninety degrees from the usual meaning of their orientation for the purpose of more fully describing the preferred embodiments to be described below.

The DRAM maintains the other plate of the capacitor 14 at a potential that is half the potential that represents a logic value of one or a full potential swing. Those of ordinary skill in the art refer to the potential for a logic value of one as $V_{CC}$. Storing a logic value of one in the cell 10 includes raising the bitline 16 to a potential of $V_{CC}$ and raising the wordline 18 to a higher potential, $V_{CCP}$. $V_{CCP}$ is a potential that will enable the transistor 12 to conduct throughout the charging process. The transistor 12 conducts and the upper plate of the capacitor 14 is charged to a potential of $V_{CC}$. Storing a logic value of zero in the cell 10 includes lowering the bitline 16 to a potential of zero and raising the wordline 18 to $V_{CCP}$. The transistor 12 conducts and the upper plate of the capacitor 14 is discharged to zero potential through the transistor 12.

Reading the logic value stored in the cell 10 includes raising the potential on the wordline 18 to $V_{CCP}$. The transistor 12 conducts, transferring charge between the capacitor 14 and the bitline 16. A sense amplifier (not shown) detects a change in potential of the bitline 16, amplifies the change, and provides an output representative of the logic value that was stored in the memory cell 10. In a preferred embodiment of the memory cell 10, the bitline 16 is pre-charged to a potential of $\frac{1}{2}V_{CC}$ before the wordline 18 potential rises to initiate the reading process. If a logic value of one was stored in the cell 10, the potential on the upper plate of the capacitor 14 is expected to be greater than $\frac{1}{2}V_{CC}$, having fallen from $V_{CC}$ due to leakage. In this case, the potential on the bitline 16 will rise slightly from $\frac{1}{2}V_{CC}$. Alternatively, if a logic value of zero was stored in the cell 10, the potential on the upper plate of the capacitor 14 is expected to be less than $\frac{1}{2}V_{CC}$, having risen from zero due to leakage. In this case, the potential on the bitline 16 will fall slightly from $\frac{1}{2}V_{CC}$. The sense amplifier detects the slight rise or fall of potential on the bitline 16 and outputs a potential corresponding to a logic value of one or zero accordingly.

Figure 2:
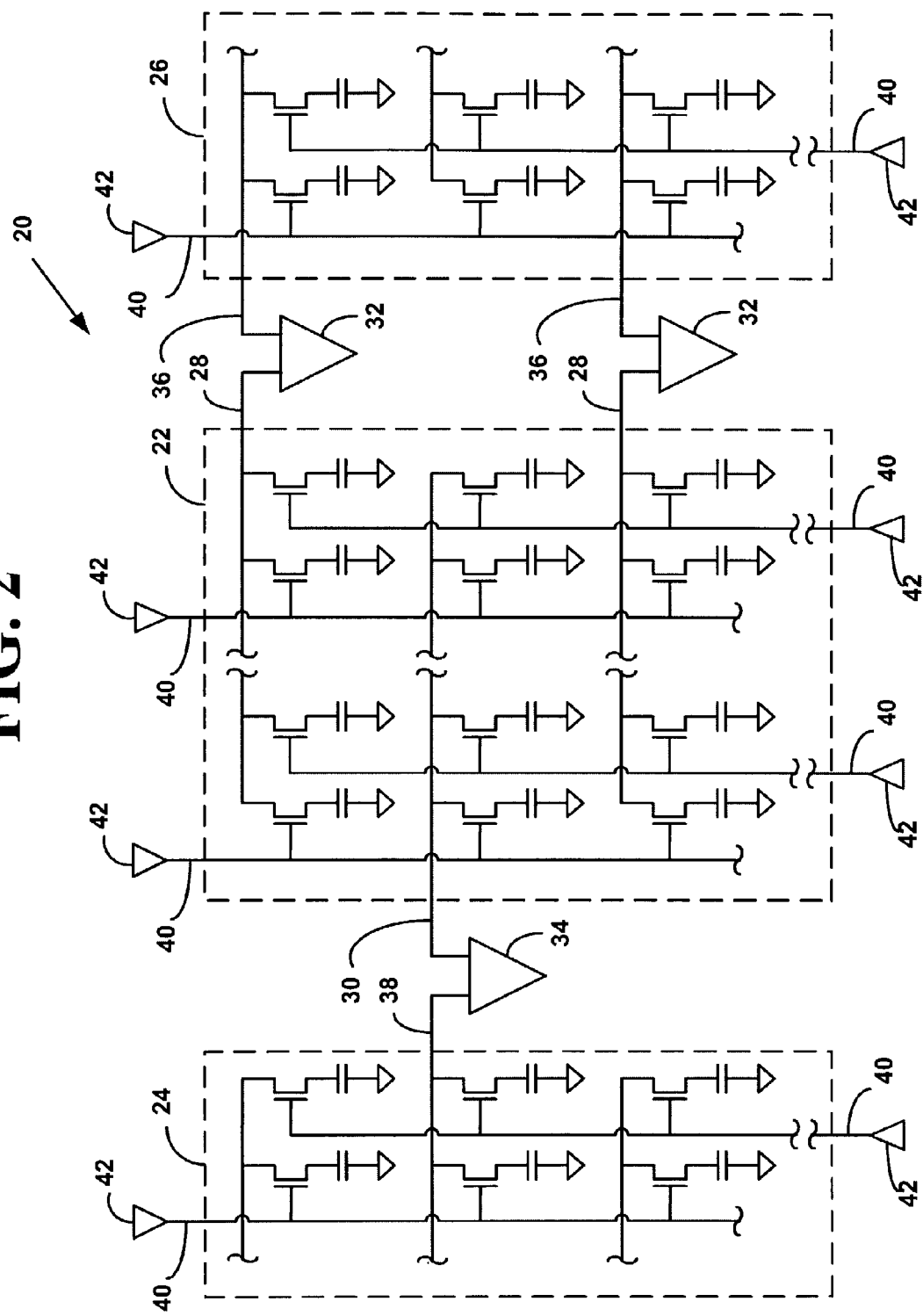
FIG. 2 is a diagram illustrating a preferred configuration of a DRAM array.

FIG. 2 is a diagram illustrating a preferred configuration of a portion of a DRAM array 20. A DRAM array 20 of memory cells 10 may comprise one or more memory sections 22–26. An example of a DRAM array 20 is a sixty-four Megabit ("Mb") array, where one Megabit is $2^{20}$ bits or 1,048,576 bits. As shown in FIG. 2, a memory section 22 may have a left neighboring section 24 and a right neighboring section 26. Sections 22–26 at the edge of the die of the DRAM integrated circuit ordinarily lack a left 24 or right 26 neighboring section.

Dividing the DRAM array 20 into memory sections 22–26 provides shorter bitlines and/or wordlines than if the lines ran across the whole DRAM array 20. As is known to those of ordinary skill in the art, long lines may have large resistances or have parasitic capacitances with neighboring lines that reduce the performance of the DRAM array 20. For example, a 64 Mb DRAM array 20 may include sixteen sections 22–26, each comprising 4 Mb of memory. It should be understood, however, that the exemplary memory sizes of 64 Mb and 4 Mb are for illustrative purposes only and that the present invention is not restricted to 64 Mb DRAM arrays having 4 Mb sections and that other array and section sizes are possible.

In a preferred arrangement of bitlines within the section 22, alternate bitlines exit the section 22 in opposing directions. One selection of bitlines exits the section 22 to the right of the section 22. These bitlines are termed 'right bitlines' 28 ("RBLs") by those of ordinary skill in the art. Another selection of bitlines exits the section 22 to the left of the section 22. These bitlines are termed 'left bitlines' 30 ("LBLs"). Each RBL 28 connects to a sense amplifier 32, termed a 'right sense amplifier' 32 by those of ordinary skill in the art. Each LBL 30 connects to a sense amplifier 34, often termed a 'left sense amplifier' 34 by those of ordinary skill in the art.

In a preferred embodiment of the DRAM array 20, neighboring memory sections 22–26 share common sense amplifiers 32, 34. For example, RBLs 28 of the section 22 share sense amplifiers 32 with the LBLs 36 of the right neighboring section 26. Also, LBLs 30 of the section 22 share sense amplifiers 34 with the RBLs 38 of the left neighboring section 24. This sharing cuts the number of required sense amplifiers 32, 34 for the DRAM array 20 by a factor of approximately two. If the DRAM array 20 does not fire more than one wordline 40 at a time, the sense amplifiers 32, 34 do not encounter ambiguities regarding from which section 22–26 they are reading.

The DRAM array 20 includes wordline drivers 42, which raise the potential on the gates of the transistors 12 in a row substantially to $V_{CCP}$ for reading, writing, or refreshing the array 20. The DRAM array 20 also includes write drivers (not shown) for raising or lowering the potentials on the bitlines 36 that charge the capacitors 14 of memory cells 10 to potentials corresponding to logic values of one or zero.

Self-repairing DRAM

Figure 3:
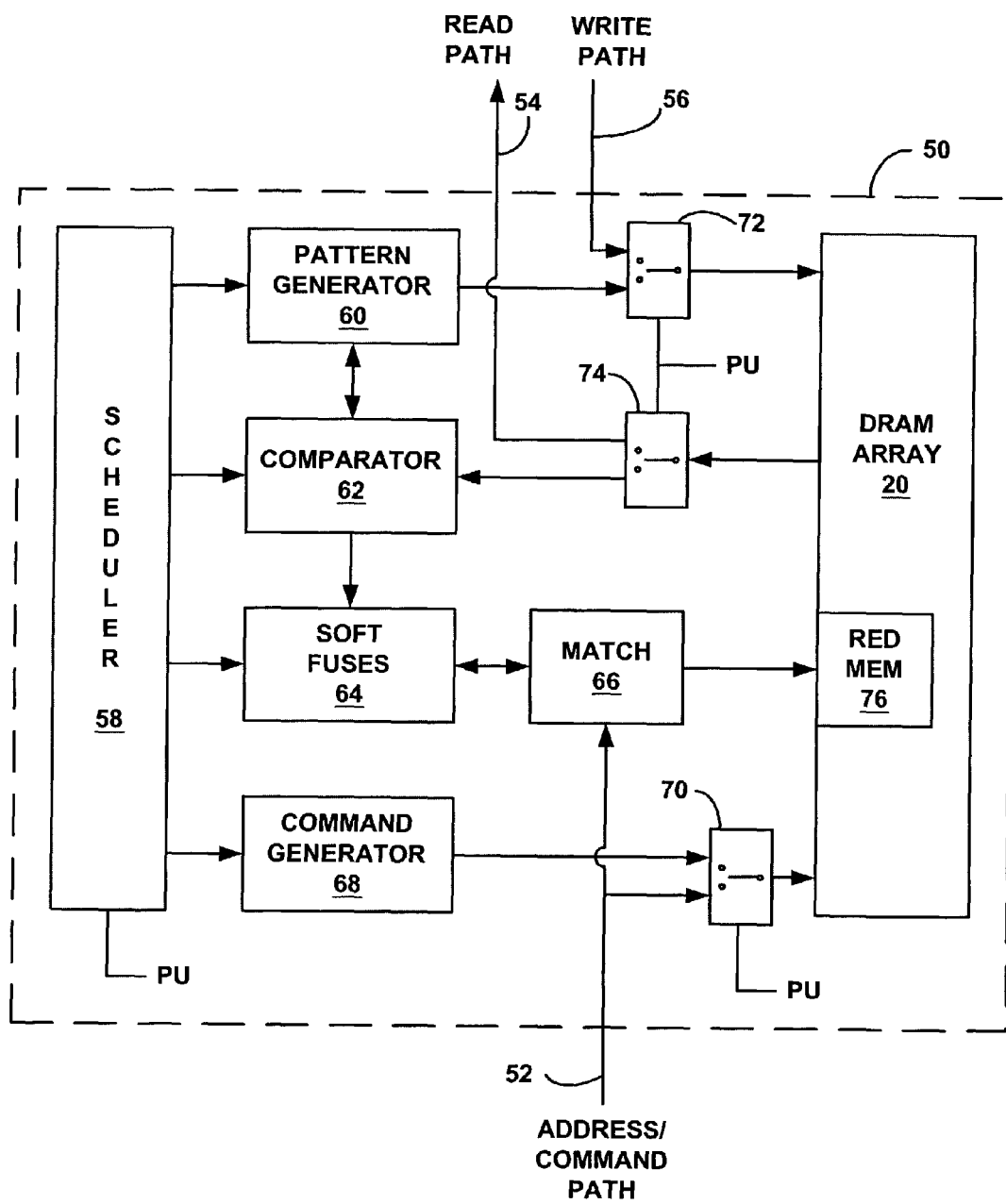
FIG. 3 is a block diagram illustrating a preferred embodiment of a self-repairing DRAM integrated circuit.

Referring to FIG. 3, each section 22–26 of the DRAM array 20 may include redundant cells 10 that are addressed by redundant wordlines 40 and/or bitlines 38. The redundant cells 10 substitute for failed cells 10 within the section 22–26 and may repair the DRAM array 20 by restoring the array 20 to its nominal memory capacity.

FIG. 3 is a block diagram illustrating a preferred embodiment of a self-repairing DRAM integrated circuit 50. The DRAM integrated circuit 50 includes a DRAM array 20 of memory cells 10, which may be arranged in sections 22–26 and addressed by wordlines 18 and bitlines 16. The DRAM integrated circuit 50 includes an address and command path 52, a read path 54, and a write path 56. The paths 52–56 transfer data, commands, and addresses between the DRAM integrated circuit 20 and other electronic components (not shown) in the electronic device. The address/command path 52 accepts addresses for cells, wordlines, and/or bitlines within the DRAM array 20 to which data is written or from which data is read. The address/command path 52 also accepts commands for controlling the operations of the DRAM array 20, such as instructing the DRAM integrated circuit 50 to read out data stored in the DRAM array 20 or to store data written into the DRAM array 20. The read path 54 outputs data from the DRAM array 20 and the write path 56 accepts data for storing in the DRAM array 20.

As shown in FIG. 3, the self-repairing DRAM integrated circuit 50 also includes a scheduler circuit 58, a pattern generator circuit 60, a comparator circuit 62, a soft fuse circuit 64, a match circuit 66, a command generator circuit 68, and path switching circuits 70–74. The paths 52–56 may also include multiplexer and/or demultiplexer circuits (not shown) for encoding and/or decoding binary words. In one preferred embodiment, the path switching circuits 70–74 include one or more multiplexer and/or demultiplexer circuits.

The self-repairing DRAM integrated circuit 50 may be fabricated using integrated circuit fabrication techniques familiar to those of ordinary skill in the art, such as silicon or Gallium Arsenide ("GaAs") techniques. The scheduler circuit 58, a pattern generator circuit 60, comparator circuit 62, soft fuse circuit 64, match circuit 66, command generator circuit 68, and path switching circuits 70–74 may be designed and constructed using a schematic library of circuit primitives suitable for mask processes, as is familiar to those of ordinary skill in the art. In a preferred embodiment these components 58–74 are fabricated on the same substrate as the DRAM array 20. In another embodiment, the components 58–74 are fabricated on a separate substrate than the DRAM array 20. In this latter embodiment, the separate substrate may be encapsulated in the same package as the DRAM array 20, and may communicate with the DRAM array 20 through wire bonds connecting pads on the substrates. Alternatively, the separate substrate may be encapsulated in a different package as the DRAM array 20, and may communicate with the DRAM array 20 through conducting traces on a printed circuit board that hosts the different packages.

FIG. 4 is a flow diagram illustrating a preferred method 80 of correcting for a failed memory cell 10 in a DRAM integrated circuit 50. The method 80 includes determining an address of the failed memory cell 10 at step 82. At step 84, the DRAM integrated circuit 50 sets one or more soft fuses to record the address of the failed memory cell 10. The DRAM integrated circuit 50 associates a redundant memory cell 76 with the one or more set soft fuses at step 86. The redundant memory cell 76 substitutes for the failed memory cell 10 when the DRAM integrated circuit 50 matches the address.

In a preferred embodiment, the DRAM integrated circuit 50 performs a self-repair process during a power-up process. The power-up process occurs after power is first supplied to the DRAM integrated circuit 50 and before the DRAM integrated circuit 50 stores data. When power is first supplied to the DRAM integrated circuit 50, internal voltage generators (not shown) turn on. Once the generators have reached appropriate potentials for operation of the DRAM integrated circuit 50, the power-up process generates a power-up ("PU") signal, which activates the scheduler circuit 58. The scheduler circuit 58 controls the self-repair process.

The PU signal also causes the path switching circuits 70–74 to switch to a first switching state. In the first switching state, the DRAM array 20 is disconnected from the address/command path 52, the read path 54, and the write path 56 respectively. During the power-up process, no data is written into or read out of the DRAM array 20. Instead, the DRAM array 20 accepts data from the pattern generator circuit 60 and the DRAM array 20 outputs data to the comparator circuit 62. Also, during the power-up process, in response to the PU signal enabling the path switching circuits 70 in the address/command path 52, the DRAM array 20 accepts addresses and commands from the command generator circuit 68.

After completing the self-repair process, the scheduler circuit 58 clears the PU signal, which causes the path switching circuits 70–74 to switch to a second switching state. In the second switching state, the DRAM array 20 is connected to the address/command path 52, the read path 54, and the write path 56 respectively. The DRAM array 20 may thereafter accept addresses and commands from the address/command path 52, accept data to be stored in the DRAM array 20 from the write path 56, and output data stored in the DRAM array 20 to the read path 54.

FIG. 5 is a flow diagram illustrating a preferred method of determining the address of the failed memory cell 10 at step 82 of the method 80 of FIG. 4. Step 82 includes generating a pattern at step 90. At step 92, the DRAM integrated circuit 50 writes the pattern to one or more memory cells 10 in the DRAM array 20. The DRAM integrated circuit 50 reads data from the one or more memory cells 10 at step 94. At step 96, the DRAM integrated circuit 50 compares the data with the pattern. The DRAM integrated circuit 50 identifies the address of the failed memory cell 10 when the data and the pattern do not match.

The scheduler circuit 58 controls the self-repair process. In a preferred embodiment, the scheduler circuit 58 is a block of hard-wired logic gates that receives the clock signal and reconfigures its output in response to each additional clock pulse. For example, the hard-wired logic may include a binary counter that binary adds a logic one to a binary word with each clock pulse. Each resulting binary word in the binary counter may be associated with a distinct set of output signals through AND logic gates, as is familiar to those of ordinary skill in the art. The set of output signals instruct other elements 60–74 of the DRAM integrated circuit 50 to perform their respective operations.

The scheduler circuit 58 instructs the pattern generator circuit 60 to generate a pattern of logic values for storing in the DRAM array at step 90. In a preferred embodiment, the pattern generator circuit 60 is another block of hard-wired logic gates, such as binary counters, that cycle through a sequence of logical ones and zeroes in response to the clock. One example of the pattern results in storage of a logic value of one in each cell 10 in the DRAM array 20. Another example of the pattern results in storage of a logic value of zero in each cell 10 in the DRAM array 20. Yet another example of the pattern results in storage of alternating logic values of one and zero in the cells 10 in the DRAM array 20. Those of ordinary skill in the art also term this pattern a "checkerboard" pattern. During the storage operations, the scheduler circuit 58 instructs the command generator 68 to generate the command for writing data to the DRAM array 20. The command generator 68 also generates the addresses for the appropriate cells 10 in the DRAM array 20 to which the logic values of the pattern are written. In this manner, the DRAM array 20 stores the generated pattern at step 92.

In a preferred embodiment, the command generator 68 is another block of hard-wired logic gates that associate a command for the DRAM array 20 in response to the instruction received from the scheduler circuit 58. Examples of commands that are generated by the command generator 68 include Row Address Strobe ("RAS"), Column Address Strobe ("CAS"), and Write Enable ("WE") commands familiar to those of ordinary skill in the DRAM art.

The scheduler circuit 58 of the DRAM integrated circuit 50 instructs the command generator 68 to generate the command for reading data from the DRAM array 20. The command generator 68 also generates the addresses for the appropriate cells 10 in the DRAM array 20 from which the logic values of the data are read. In this manner, the DRAM integrated circuit 50 reads data from the DRAM array 20 into the comparator circuit 62 at step 94. For each memory cell 10 to be tested in the DRAM array 20, the comparator circuit 62 compares the logic value read from the memory cell 10 with the logic value generated for that memory cell 10 by the pattern generator circuit 60. If the logic values do not match, comparator circuit 62 identifies the memory cell 10 as failed at step 98.

When the comparator circuit 62 identifies the failed memory cell 10, the comparator circuit 62 passes the address of the failed memory cell 10 to the soft fuse circuit 64. At step 84 of the method 80 of FIG. 4, the DRAM integrated circuit 50 sets one or more soft fuses in the soft fuse circuit 64 to record the address of the failed memory cell 10. In one preferred embodiment, the soft fuse circuit 64 stores the address of the bitline 16 to which the failed memory cell 10 belongs. In another preferred embodiment, the soft fuse circuit 64 stores the address of the wordline 18 to which the failed memory cell 10 belongs. In yet another preferred embodiment, the soft fuse circuit 64 stores the addresses of the bitline 16 and the wordline 18 to which the failed memory cell 10 belongs, i.e., the address of the failed memory cell 10. As is known by one of ordinary skill in the art, substituting a complete row or column for the row or column that contains the failed memory cell 10, rather than replacing the single failed memory cell 10 with a single redundant memory cell 76, may increase the speed of operation of the DRAM integrated circuit 50.

In a preferred embodiment, the soft fuses are latch circuits, such as Static Random Access Memory ("SRAM") cells. The soft fuses lose their stored information, such as the addresses of the failed memory cells 10, when the DRAM integrated circuit 50 loses power. The match circuit 66 also associates one or more redundant memory cells 76 with the soft fuses that store the address of the failed memory cell 10. In a preferred embodiment, the redundant memory cells 76 are in a redundant row or column of the DRAM array 20 and the method 80 of repairing the DRAM integrated circuit 50 includes the substitution of a complete row or column when it detects a failed memory cell 10. In this manner, the DRAM integrated circuit 50 records the address of the failed memory cell 10, either as a bitline 16 address, a wordline 18 address, or both, and provides a substitute bitline 16, wordline 18, or memory cell 10 in redundant memory cells 76 in the DRAM array 20.

In operation, after the scheduler circuit 58 has cleared the PU signal, the DRAM array 20 may accept addresses and commands from the address/command path 52, accept data to be stored in the DRAM array 20 from the write path 56, and output data stored in the DRAM array 20 to the read path 54. When the match circuit 66 recognizes that a presented address on the address/command path 52 is identical to a stored address in the soft fuse circuit 64, the match circuit 66 substitutes the address of the bitline 16, wordline 18, or memory cell 10 in the redundant memory 76. In a preferred embodiment, the match circuit 66 is a block of hard-wired comparison logic, such as XOR logic gates or difference amplifiers, and other logic gates familiar top those of ordinary skill in the DRAM art.

The DRAM integrated circuit 20 writes data on the write path 56 into the associated redundant memory 76 of the DRAM array 20 at the substitute address instead of writing the data into the DRAM array 20 at the presented address. Also, the DRAM integrated circuit 20 reads data from the associated redundant memory 76 of the DRAM array 20 onto the read path 54 from the substitute address instead of reading the data from the DRAM array 20 at the presented address.

As the soft fuses are reset when the DRAM integrated circuit 20 loses power, the DRAM integrated circuit 20 performs the testing and self-repair method 80 each time it is powered up. As some defects may not develop until the DRAM integrated circuit 50 is in operation within the electronic device, the repeat repairing upon each power-up permits the DRAM integrated circuit 50 to compensate for failing memory cells 10. In this manner, the DRAM integrated circuit 50 may have an extended lifetime compared with DRAMs whose redundancy is permanently fixed during the process of manufacturing and testing.

The foregoing detailed description is merely illustrative of several physical embodiments of the invention. Physical variations of the invention, not fully described in the specification, may be encompassed within the purview of the claims. In addition, the steps of the flow diagrams may be taken in sequences other than those described, and more or fewer elements or components may be used in the block diagrams. Accordingly, any narrower description of the elements in the specification should be used for general guidance, rather than to unduly restrict any broader descriptions of the elements in the following claims.

We claim:

1. A method of correcting for a failed memory cell in a DRAM integrated circuit, the method comprising:
(a) determining an address of the failed memory cell;
(b) setting at least one soft fuse associated with the DRAM integrated circuit to record the address of the failed memory cell; and
(c) associating at least one redundant memory cell with the at least one set soft fuse, wherein the at least one redundant memory cell substitutes for the failed memory cell when the DRAM integrated circuit matches the address.

2. The method of claim 1 further comprising:
repeating (a) to (c) to correct for a plurality of failed memory cells in the DRAM integrated circuit.

3. The method of claim 1 wherein (a) to (c) are performed during a power-up process for the DRAM integrated circuit.

4. The method of claim 1 wherein (a) comprises:
generating a pattern of logic values;
writing the pattern to at least one memory cell in the DRAM integrated circuit;
reading data from at least one memory cell;
comparing the data with the pattern; and
identifying the address of the failed memory cell when the data and the pattern do not match.

5. The method of claim 4 wherein the generating step comprises:
associating a logic value of one with the one or more memory cells in the DRAM integrated circuit.

6. The method of claim 4 wherein the generating step comprises:
associating a logic value of zero with the at least one memory cell in the DRAM integrated circuit.

7. The method of claim 4 wherein the generating step comprises:
associating a logic value of one with a first selection of the at least one memory cell in the DRAM integrated circuit; and
associating a logic value of zero with a second selection of the at least one memory cell in the DRAM integrated circuit.

8. The method of claim 7 wherein the first selection and the second selection are alternating memory cells.

9. The method of claim 4 further comprising:
configuring at least one path switching circuit associated with the DRAM integrated circuit to a first switching state, wherein the at least one memory cell is disconnected from at least one path in the first switching state.

10. The method of claim 9 further comprising:
configuring the at least one path switching circuit associated with the DRAM integrated circuit to a second switching state, wherein the at least one memory cell is connected to the at least one path in the second switching state.

11. A self-repairing DRAM integrated circuit comprising:
at least one memory cell;
a pattern generator circuit for writing a pattern of logic values to the at least one memory cell;
a comparator circuit for comparing the pattern with data read from the at least one memory cell and determining an address of a failed memory cell when the pattern and the data do not match;
a soft fuse circuit having, at least one internal soft fuse for recording the address of the failed memory cell;
a match circuit for associating at least one redundant memory cell with the at least one internal soft fuse to substitute for the failed memory cell.

12. A self-repairing DRAM integrated circuit comprising:
at least one memory cell;
a pattern generator circuit for writing a pattern of logic values to the at least one memory cell;
a comparator circuit for comparing the pattern with data read from the at least one memory cell and determining an address of a failed memory cell when the pattern and the data do not match; and
a soft fuse circuit for recording the address of the failed memory cell,
wherein the pattern generator circuit, the comparator circuit, and the soft fuse circuit operate during a power-up process for the DRAM integrated circuit.

13. A self-repairing DRAM integrated circuit comprising:
at least one memory cell;
a pattern generator circuit for writing a pattern of logic values to the at least one memory cell;
a comparator circuit for comparing the pattern with data read from the at least one memory cell and determining an address of a failed memory cell when the pattern and the data do not match; and
a soft fuse circuit for recording the address of the failed memory cell,
wherein the soft fuse circuit comprises one or more latch circuits.

14. A self-repairing DRAM integrated circuit comprising:
at least one memory cell;
a pattern generator circuit for writing a pattern of logic values to the at least one memory cell;
a comparator circuit for comparing the pattern with data read from the at least one memory cell and determining an address of a failed memory cell when the pattern and the data do not match;
a soft fuse circuit for recording the address of the failed memory cell;
at least one redundant memory cell; and
a match circuit for associating the at least one redundant memory cell with the recorded address in the soft fuse circuit.

15. The self-repairing DRAM integrated circuit of claim 14, wherein the match circuit substitutes at least one address of the at least one redundant memory cell for the address of the failed memory cell when presented with the address of the failed memory cell.

16. A self-repairing DRAM integrated circuit comprising:
at least one memory cell;
a pattern generator circuit for writing a pattern of logic values to the at least one memory cell;
a comparator circuit for comparing the pattern with data read from the at least one memory cell and determining an address of a failed memory cell when the pattern and the data do not match;
a soft fuse circuit for recording the address of the failed memory cell;
a command generator circuit for generating commands that operate the DRAM integrated circuit during self-repair; and
a scheduler circuit for controlling the pattern generator circuit, the comparator circuit, the soft fuse circuit, and the command generator circuit.

17. The self-repairing DRAM integrated circuit of claim 16, wherein the command generator circuit and the scheduler circuit operate during a power-up process for the DRAM integrated circuit.

18. The self-repairing DRAM integrated circuit of claim 16, wherein the command generator circuit generates addresses to access the at least one memory cell during self-repair.

19. A self-repairing DRAM integrated circuit comprising:
at least one memory cell;

a pattern generator circuit for writing a pattern of logic values to the at least one memory cell;

a comparator circuit for comparing the pattern with data read from the at least one memory cell and determining an address of a failed memory cell when the pattern and the data do not match;

a soft fuse circuit for recording the address of the failed memory cell; and at least one switching circuit, wherein the at least one memory cell is disconnected from at least one path by the at least one switching circuit during self-repair.

20. In a DRAM integrated circuit comprising an array of memory cells, an improved method of recording an address of a failed memory cell in the array, wherein the improvement comprises:

internally generating a pattern of logic values and writing the pattern to the array;

comparing the pattern with data read out of the array in a comparator circuit of the DRAM integrated circuit to determine the address of the failed memory cell when the pattern and data do not match;

setting at least one soft fuse to record the address; and associating at least one redundant memory cell with the at least one internal soft fuse to substitute for the failed memory cell.

21. In a DRAM integrated circuit comprising an array of memory cells, and redundant memory cells, an improved on-chip system for substituting addresses of redundant memory cells for addresses of failed memory cells in the array, wherein the improvement comprises:

an internal pattern generator circuit for generating a pattern of logic values and writing the pattern to the array;

an internal comparator circuit for comparing the pattern with data read out of the a array to determine the addresses of the failed memory cells when the pattern and data do not match; and an internal soft fuse circuit for recording the addresses of the failed memory cells; and a match circuit for associating at least one redundant memory cell with the internal soft fuse to substitute for the failed memory cells.

22. In a DRAM integrated circuit comprising an array of memory cells, and redundant memory cells, an improved on-chip system for substituting addresses of redundant memory cells for addresses of failed memory cells in the array, wherein the improvement comprises:

an internal pattern generator circuit for generating a pattern of logic values and writing the pattern to the array;

an internal comparator circuit for comparing the pattern with data read out of the array to determine the addresses of the failed memory cells when the pattern and data do not match;

an internal soft fuse circuit that record the addresses of the failed memory cells; and an internal scheduler circuit for controlling the internal pattern generator circuit, the internal comparator circuit, and the an internal soft fuse circuit during a power-up process for the DRAM integrated circuit.

23. The improved on-chip system of claim 22, further comprising:

an internal command generator circuit for generating commands that operate the DRAM integrated circuit and addresses for the array of memory cells in response to instructions from the internal scheduler circuit.

24. A method of correcting for a failed memory cell in a DRAM integrated circuit, the method comprising the steps of:

configuring at least one path switching circuit associated with the DRAM integrated circuit to a first switching state during a power-up process, wherein at least one memory cell is disconnected from at least one path in the first switching state;

generating a pattern of logic values;

writing the pattern to at least one memory cell in the DRAM integrated circuit;

reading data from the at least one memory cell;

comparing the data with the pattern;

identifying the address of the failed memory cell when the data and the pattern do not match;

setting at least one soft fuse associated with the DRAM integrated circuit to record the address of the failed memory cell;

associating at least one redundant memory cell with the at least one set soft fuse, wherein the at least one redundant memory cell substitutes for the failed memory cell when the DRAM integrated circuit matches the address; and configuring the at least one path switching circuit to a second switching state, wherein the at least one memory cell is connected to the at least one path in the second switching state.

25. A self-repairing DRAM integrated circuit comprising:

one or more memory cells;

a pattern generator circuit for writing a pattern of logic values to the one or more memory cells;

a comparator circuit for comparing the pattern with data read from the one or more memory cells and determining an address of a failed memory cell when the pattern and the data do not match; and a soft fuse circuit for recording the address of the failed memory cell, one or more redundant memory cells;

a match circuit for associating the one or more redundant memory cells with the recorded address in the soft fuse circuit, and wherein the match circuit substitutes one or more addresses of the one or more redundant memory cells for the address of the failed memory cell when presented with the address of the failed memory cell;

a command generator circuit for generating commands that operate the DRAM integrated circuit and generates addresses to access the one or more memory cells during self-repair; and a scheduler circuit for controlling the pattern generator circuit, the comparator circuit, the soft fuse circuit, the match circuit, and the command generator circuit during a power-up process.

26. A system for correcting for a failed memory cell in a DRAM integrated circuit comprising:

(a) means for determining an address of the failed memory cell;

(b) means for recording the address of the failed memory cell in at least one internal soft fuse, wherein (b) is in communication with (a) to receive the address from (a); and (c) means for associating at least one redundant memory cell with the at least one internal soft fuse, wherein (c) is in communication with (b) to substitute the at least one redundant memory cell for the failed memory cell when the DRAM integrated circuit matches the address.

* * * * *

UNITED STATES PATENT AND TRADEMARK OFFICE
CERTIFICATE OF CORRECTION

PATENT NO.         : 7,028,234 B2
APPLICATION NO. : 10/256463
DATED              : April 11, 2006
INVENTOR(S)       : Jennifer F. Huckaby et al.

It is certified that error appears in the above-identified patent and that said Letters Patent is hereby corrected as shown below:

Column 11, in claim 21, line 10, before "array to determine" delete "a".

Signed and Sealed this

Twentieth Day of March, 2007

JON W. DUDAS
*Director of the United States Patent and Trademark Office*